(12) United States Patent
Kaneko et al.

(10) Patent No.: US 9,927,716 B2
(45) Date of Patent: *Mar. 27, 2018

(54) LITHOGRAPHIC APPARATUS AND SURFACE CLEANING METHOD

(71) Applicant: ASML NETHERLANDS B.V., Veldhoven (NL)

(72) Inventors: Takeshi Kaneko, 's-Hertogenbosch (NL); Kornelis Tijmen Hoekerd, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,674

(22) Filed: May 8, 2017

(65) Prior Publication Data

US 2017/0255107 A1  Sep. 7, 2017

Related U.S. Application Data

(63) Continuation of application No. 15/018,582, filed on Feb. 8, 2016, now Pat. No. 9,645,508, which is a
(Continued)

(51) Int. Cl.
*B60R 1/06* (2006.01)
*G03B 27/32* (2006.01)
(Continued)

(52) U.S. Cl.
CPC ........ *G03F 7/70341* (2013.01); *G03F 7/7095* (2013.01); *G03F 7/70925* (2013.01); *G03F 7/70975* (2013.01)

(58) Field of Classification Search
CPC .... G03F 7/70; G03F 7/70341; G03F 7/70925; G03F 7/7095; G03F 7/70975
(Continued)

(56) References Cited

U.S. PATENT DOCUMENTS 4,509,852 A  4/1985  Tabarelli
7,075,616 B2  7/2006  Derksen
(Continued)

FOREIGN PATENT DOCUMENTS

CN  101398632  4/2009
EP  1 420 300  5/2004
(Continued)

OTHER PUBLICATIONS

Japanese Office Action dated Jun. 12, 2012 in corresponding Japanese Patent Application No. 2010-263517.
(Continued)

*Primary Examiner* — Colin Kreutzer
(74) *Attorney, Agent, or Firm* — Pillsbury Winthrop Shaw Pittman, LLP

(57) ABSTRACT

An apparatus and method for cleaning a contaminated surface of a lithographic apparatus are provided. A liquid confinement structure comprises at least two openings used to supply and extract liquid to a gap below the structure. The direction of flow between the openings can be switched. Liquid may be supplied to the gap radially outward of an opening adapted for dual flow. Supply and extraction lines to respectively supply liquid to and extract liquid from the liquid confinement structure have an inner surface that is resistant to corrosion by an organic liquid. A corrosive cleaning fluid can be used to clean photo resist contamination.

20 Claims, 8 Drawing Sheets

Related U.S. Application Data continuation of application No. 14/310,873, filed on Jun. 20, 2014, now Pat. No. 9,261,796, which is a continuation of application No. 12/956,934, filed on Nov. 30, 2010, now Pat. No. 8,760,616.

(60) Provisional application No. 61/265,891, filed on Dec. 2, 2009.

(51) Int. Cl.
*G03B 27/52* (2006.01)
*G03F 7/20* (2006.01)

(58) Field of Classification Search
USPC .................... 355/30, 53, 77; 359/509
See application file for complete search history.

(56) References Cited

U.S. PATENT DOCUMENTS

| | | |
|---|---|---|
| 7,110,081 B2 | 9/2006 | Hoogendam |
| 7,251,013 B2 | 7/2007 | Ten Kate |
| 7,317,504 B2 | 1/2008 | De Smit et al. |
| 7,362,412 B2 | 4/2008 | Holmes |
| 7,403,261 B2 | 7/2008 | Jansen |
| 7,697,110 B2 | 4/2010 | Nagasaka |
| 7,880,860 B2 | 2/2011 | Jansen et al. |
| 8,547,523 B2 | 10/2013 | Riepen et al. |
| 8,760,616 B2 | 6/2014 | Kaneko et al. |
| 8,823,918 B2 | 9/2014 | Watso et al. |
| 9,261,796 B2 | 2/2016 | Kaneko et al. |
| 9,645,508 B2 * | 5/2017 | Kaneko .............. G03F 7/70341 |
| 2004/0136494 A1 | 7/2004 | Lof |
| 2004/0207824 A1 | 10/2004 | Lof |
| 2005/0225734 A1 | 10/2005 | De Smit et al. |
| 2006/0023185 A1 | 2/2006 | Hazelton et al. |
| 2006/0038968 A1 | 2/2006 | Kemper |
| 2006/0119809 A1 | 6/2006 | Verhagen |
| 2006/0132731 A1 | 6/2006 | Jansen et al. |
| 2006/0158627 A1 | 7/2006 | Kemper |
| 2007/0091287 A1 | 4/2007 | Chang et al. |
| 2007/0195303 A1 | 8/2007 | Poon et al. |
| 2008/0018867 A1 | 1/2008 | Fujiwara et al. |
| 2008/0049201 A1 | 2/2008 | Stavenga et al. |
| 2008/0198345 A1 | 8/2008 | Kawasaki |
| 2008/0202555 A1 | 8/2008 | Shibazaki |
| 2008/0212046 A1 | 9/2008 | Riepen |
| 2008/0284990 A1 | 11/2008 | De Jong et al. |
| 2008/0284991 A1 | 11/2008 | Nishii |
| 2009/0027635 A1 | 1/2009 | De Jong |
| 2009/0061331 A1 | 3/2009 | Nakano |
| 2009/0066922 A1 | 3/2009 | Nakano |
| 2009/0091716 A1 | 4/2009 | Kadijk et al. |
| 2009/0109413 A1 | 4/2009 | Shibazaki |
| 2009/0115977 A1 | 5/2009 | Nagasaka et al. |
| 2009/0174871 A1 | 7/2009 | De Jong |
| 2009/0225286 A1 | 9/2009 | Nagasaka et al. |
| 2009/0237631 A1 | 9/2009 | Poon et al. |
| 2009/0251672 A1 | 10/2009 | Nagasaka |
| 2009/0284715 A1 | 11/2009 | Watso et al. |
| 2009/0316120 A1 | 12/2009 | Shiraishi et al. |
| 2010/0045949 A1 | 2/2010 | Nakano et al. |
| 2010/0060868 A1 | 3/2010 | Tanasa |
| 2010/0099050 A1 | 4/2010 | Yoshida |
| 2010/0282278 A1 | 11/2010 | Arai |
| 2012/0019803 A1 | 1/2012 | Hoshino et al. |
| 2012/0062858 A1 | 3/2012 | Tanaka et al. |
| 2012/0188521 A1 | 7/2012 | Sato |
| 2016/0209760 A1 | 7/2016 | Kaneko et al. |

FOREIGN PATENT DOCUMENTS

| | | |
|---|---|---|
| EP | 2 034 515 | 3/2009 |
| JP | 2006-032750 | 2/2006 |
| JP | 2009-016421 | 1/2009 |
| JP | 2009-260352 | 11/2009 |
| JP | 2009-267401 | 11/2009 |
| TW | 2009-47150 | 11/2009 |
| WO | 99/49504 | 9/1999 |
| WO | 2005/064405 | 7/2005 |
| WO | 2008/143357 | 11/2008 |
| WO | 2009/128554 | 10/2009 |

OTHER PUBLICATIONS

Korean Office Action dated Aug. 21, 2012 in corresponding Korean Patent Application No. 10-2010-0122113.

Chinese Office Action dated Apr. 3, 2013 in corresponding Chinese Patent Application No. 201010575773.4.

* cited by examiner

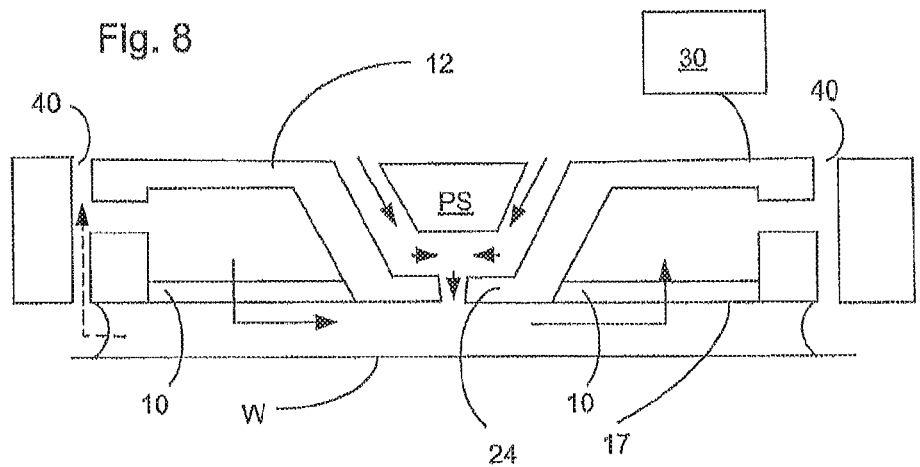
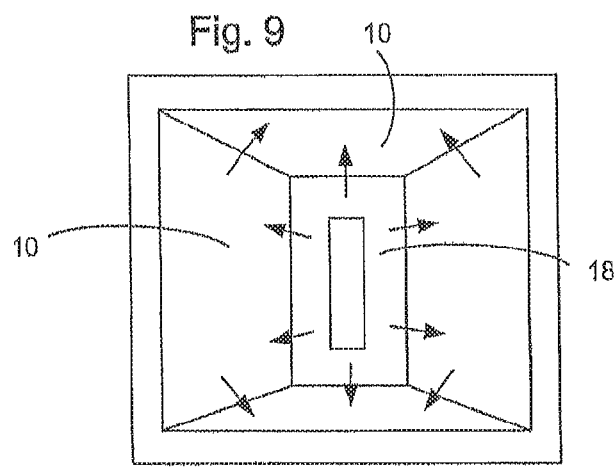
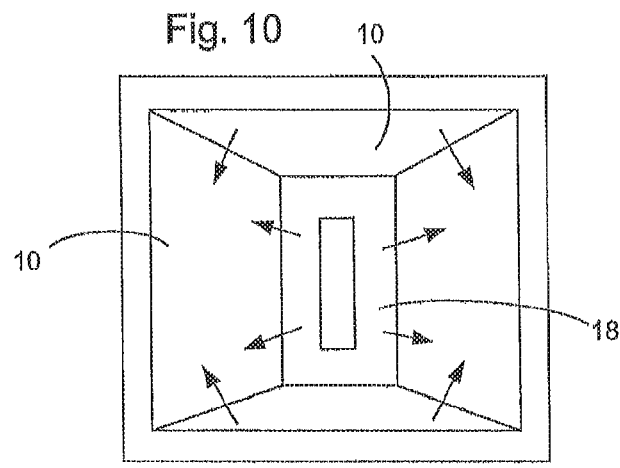

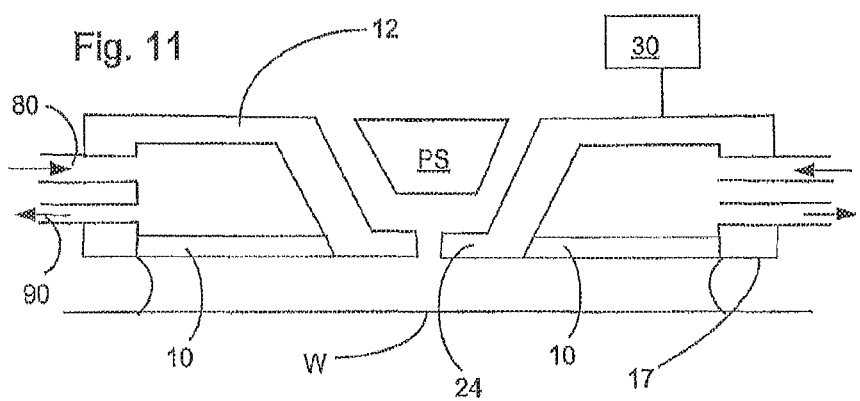
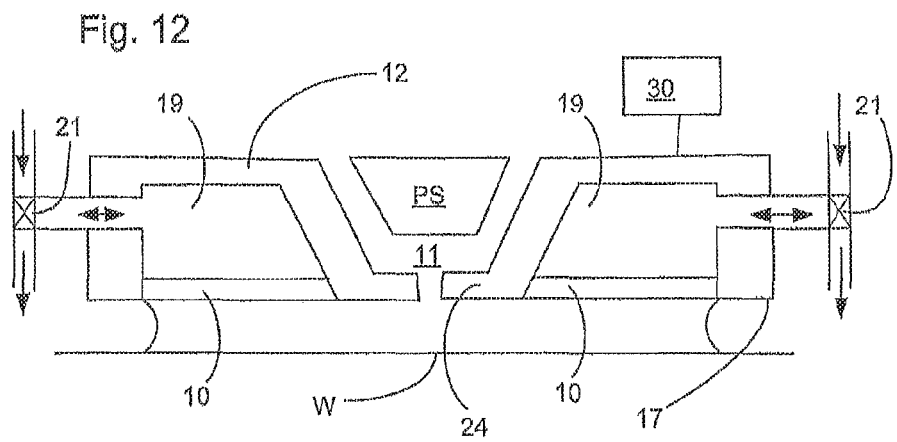
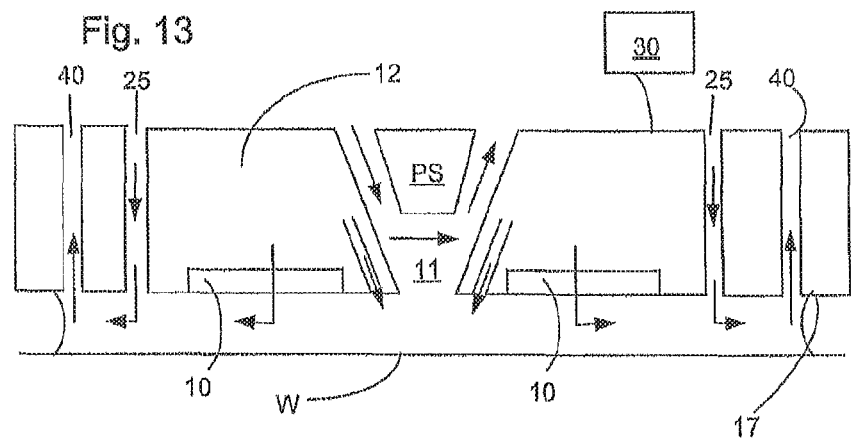

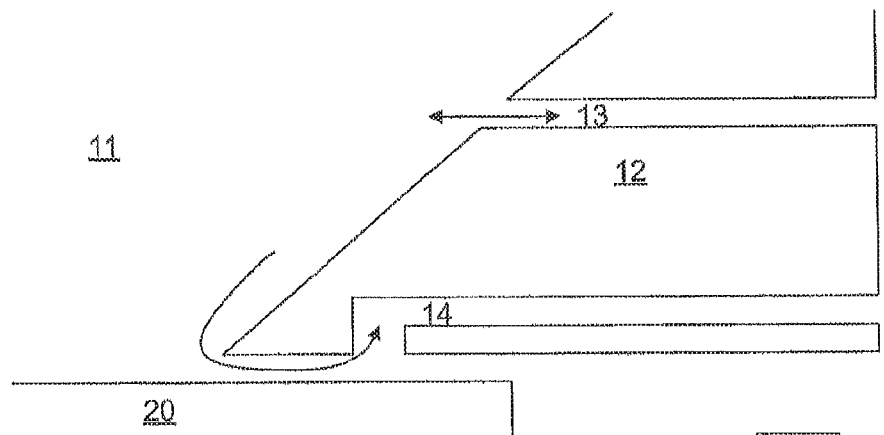
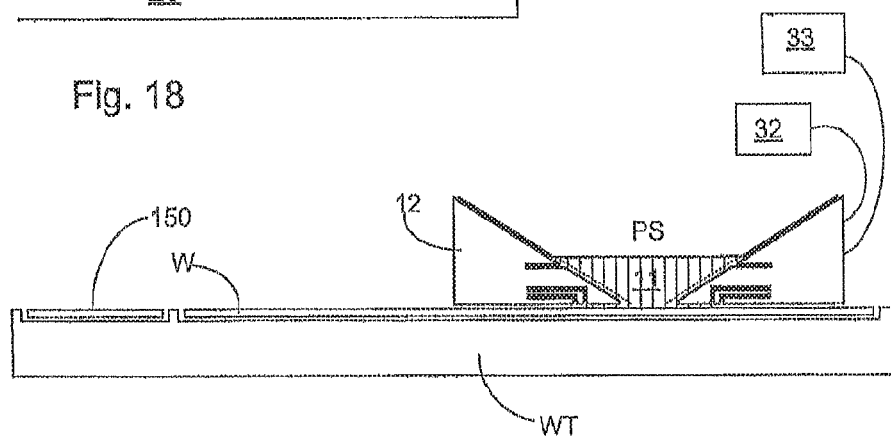
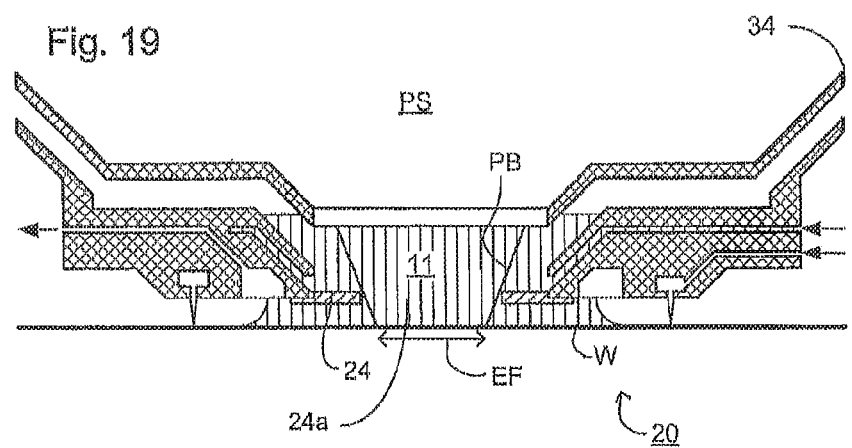

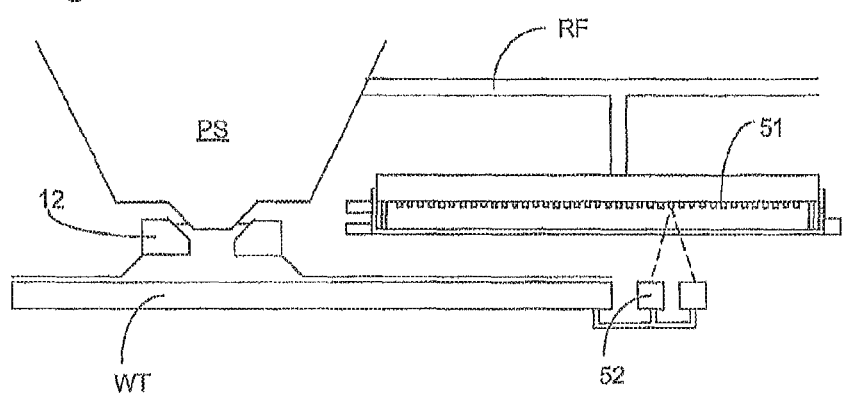

LITHOGRAPHIC APPARATUS AND SURFACE CLEANING METHOD

This application is a continuation of U.S. patent application Ser. No. 15/018,582, filed Feb. 8, 2016, now allowed, which is a continuation of U.S. patent application Ser. No. 14/310,873, filed Jun. 20, 2014, now U.S. Pat. No. 9,261,796, which is a continuation of U.S. patent application Ser. No. 12/956,934, filed Nov. 30, 2010, now U.S. Pat. No. 8,760,616, which claims the benefit of priority under 35 U.S.C. § 119(e) to U.S. Provisional Patent Application No. 61/265,891, filed on Dec. 2, 2009. The entire content of each of the foregoing applications is incorporated herein in its entirety by reference.

FIELD

The present invention relates to a lithographic apparatus and a method of cleaning a surface of an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space 11 between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. This type of arrangement may be referred to as a localized immersion system.

Another arrangement is an all wet arrangement in which the immersion liquid is unconfined as disclosed in PCT Patent Application Publication No. WO 2005/064405. In such a system the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States Patent Application Publication No. US 2006/0119809. A member is provided which covers the substrate in all positions and which is arranged to have immersion liquid extending between it and the top surface of the substrate and/or substrate table which holds the substrate.

In European Patent Application Publication No. EP 1420300 and United States Patent Application Publication No. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table may be moved away from its exposure position to a position in which the substrate may be removed and replaced by a different substrate. This is known as substrate swap. In a two stage lithographic apparatus, a swap of the tables may take place under the projection system.

In an immersion apparatus, immersion fluid is handled by a fluid handling system or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid, if the context is deemed appropriate.

SUMMARY

There is a need to address the issue of contamination in a lithographic apparatus, in particular an immersion lithographic apparatus. In particular, there is a need to address the issue of contamination generated by the removal of particles of top-coat material, and/or substrate material, and/or any other contaminating material. Some cleaning methods generally do not allow for in-line cleaning. Accordingly, completion of cleaning using these methods causes significant down-time of the lithographic apparatus.

It is desirable, for example, to provide a lithographic apparatus and cleaning method for dealing with contamination in an immersion type projection apparatus. Desirably, the apparatus and method relate to an in-line cleaning method.

According to an aspect, there is provided lithographic apparatus comprising:
a fluid handling system configured to confine immersion liquid to a space between a final element of a projection system and a substrate and/or a table, the fluid handling system comprising at least two openings configured to supply liquid to a gap between the fluid handling system and the substrate and/or the table and to extract liquid from the gap; and
a controller configured to control a direction of liquid flow through the at least two openings such that during a cleaning operation, the directions of liquid flow through at least two of the at least two openings are opposite.

According to a further aspect, there is provided a lithographic apparatus comprising:
a fluid handling system configured to confine immersion liquid to a space between a final element of a projection system and a substrate and/or a table, the fluid handling system comprising:
a liquid opening configured to supply liquid to a gap between the fluid handling system and the substrate and/or the table and to extract liquid from the gap; and
a supply opening, radially outward of the liquid opening, configured to supply liquid to the gap; and
a controller configured to control a direction of liquid flow through the liquid opening.

According to a further aspect, there is provided a lithographic apparatus comprising a fluid handling system configured to confine immersion liquid to a space between a final element of a projection system and a substrate and/or a table, the fluid handling system comprising a liquid supply or extraction line configured to supply cleaning liquid to, or extract cleaning liquid from, the fluid handling system, wherein an inner surface of the liquid supply or extraction line is flexible and resistant to corrosion by an organic liquid.

According to a further aspect, there is provided a method of cleaning a surface of an immersion lithographic apparatus comprising:
supplying cleaning liquid via a liquid opening to a gap between a fluid handling system for confining immersion liquid to a space between a final element of a projection system and a substrate or a table, and the substrate and/or the table;
extracting the cleaning liquid via a further liquid opening from the gap; and
controlling a direction of liquid flow through the liquid opening and the further liquid opening such that the cleaning liquid is supplied to the gap via the further liquid opening and the cleaning liquid is extracted from the gap via the liquid opening.

According to a further aspect, there is provided a method of cleaning a surface of an immersion lithographic apparatus comprising:
supplying cleaning liquid via a liquid opening to gap between a fluid handling system for confining immersion liquid to a space between a final element of a projection system and a substrate or a table, and the substrate and/or the table; and
supplying immersion liquid to the gap via a supply opening radially outward of the liquid opening from the space.

According to a further aspect, there is provided a lithographic apparatus comprising:
a fluid handling system configured to confine immersion liquid to a space between a final element of a projection system and a surface of a substrate and/or a table, the projection system configured to direct a patterned beam of radiation to a target portion of the substrate, the fluid handling system comprising:
a supply opening configured to supply cleaning liquid to a gap between the fluid handling system and the substrate and/or the table; and
an extraction opening configured to extract cleaning liquid from the gap, the extraction opening being radially outward of the supply opening; and
a controller configured to control a direction of liquid flow through the gap, so that at least a part of the liquid flow passes between the projection system and the surface of the substrate and/or table.

According to a further aspect, there is provided a lithographic apparatus comprising:
a fluid handling structure configured to confine immersion liquid to a space between a final element of a projection system and a substrate and/or a table, the fluid handling structure comprising at least two openings that are configured, during exposure of a substrate, to extract immersion liquid from a gap between the fluid handling structure and the substrate and/or the table and are each configured, during a cleaning operation, to be an extraction opening to extract liquid or a supply opening to supply a cleaning liquid; and
a controller configured to control the at least two openings such that during the cleaning operation, at least one opening is a supply opening and at least one opening is an extraction opening.

According to a further aspect, there is provided a lithographic apparatus comprising:
a fluid handling structure configured to confine immersion liquid to a space between a final element of a projection system and a substrate and/or a table, the projection system configured to direct a patterned beam of radiation to a target portion of the substrate, the fluid handling structure comprising at least two surfaces, of which a radially inner surface is formed around an optical path of the patterned beam of radiation and a radially outer surface is formed at an outer side of the radially inner surface, wherein the two surfaces are configured, during exposure of a substrate, to extract immersion liquid from a gap between the fluid handling structure and the substrate and/or the table and are configured, during a cleaning operation, to be an extraction surface to extract liquid or a supply surface to supply a cleaning liquid; and a controller configured to control the at least two surfaces such that during the cleaning operation, one of the at least two surfaces is a supply surface and another of the at least two surfaces is an extraction surface.

According to a further aspect, there is provided a method of cleaning a surface of an immersion lithographic apparatus comprising:

supplying immersion liquid to a space between a final element of a projection system and a substrate or a table; and supplying cleaning liquid to a gap between the substrate and/or the table and a fluid handling system for confining immersion liquid to the space, wherein the cleaning liquid is denser than the immersion liquid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 depicts a cross-sectional view of a fluid handling system and a controller according to an embodiment of the invention;

FIGS. 9 and 10 depict a plan view of a segmented porous member according to an embodiment of the present invention;

FIGS. 11 and 12 depict a cross-sectional view of a fluid handling system and a controller according to an embodiment of the invention;

FIG. 13 depicts a cross-sectional view of a fluid handling system and a controller according to an embodiment of the invention;

FIG. 17 depicts a closing disk according to an embodiment of the present invention;

FIG. 18 depicts a shutter member according to an embodiment of the present invention;

FIG. 19 depicts a protective flow plate according to an embodiment of the present invention; and FIG. 20 depicts a lithographic apparatus according to an embodiment of the invention.

DETAILED DESCRIPTION

Figure 1:
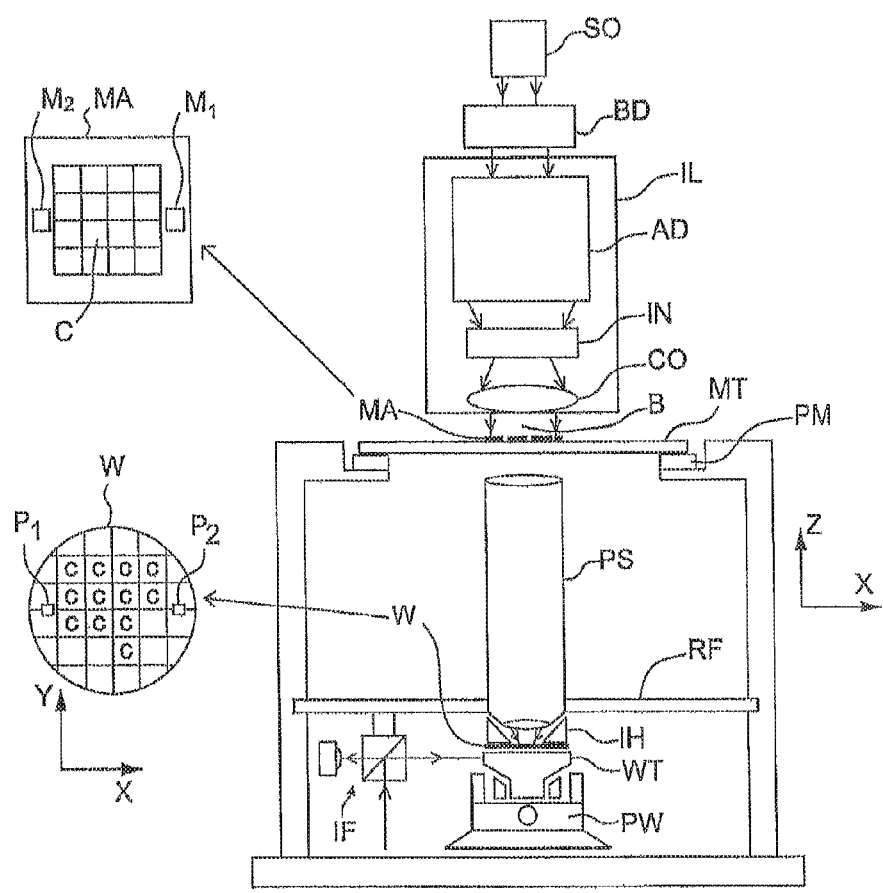
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into at least three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate moves underneath that area. FIGS. 2-5 show different supply devices which can be used in such a system. Sealing features are present to seal liquid to the localized area. One way which has been proposed to arrange for this is disclosed in PCT Patent Application Publication No. WO 99/49504.

In the all wet arrangement the liquid is unconfined. Substantially the whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 may be used in such a system. However, sealing features may not be present, may not be activated, may not be as efficient as normal or may be otherwise ineffective to seal liquid to only the localized area.

Figure 2:
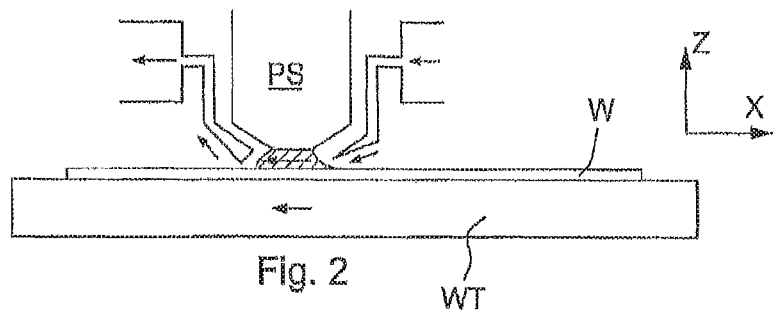
FIGS. 2 and 3 depict a liquid supply system for use in a lithographic projection apparatus.
Figure 3:
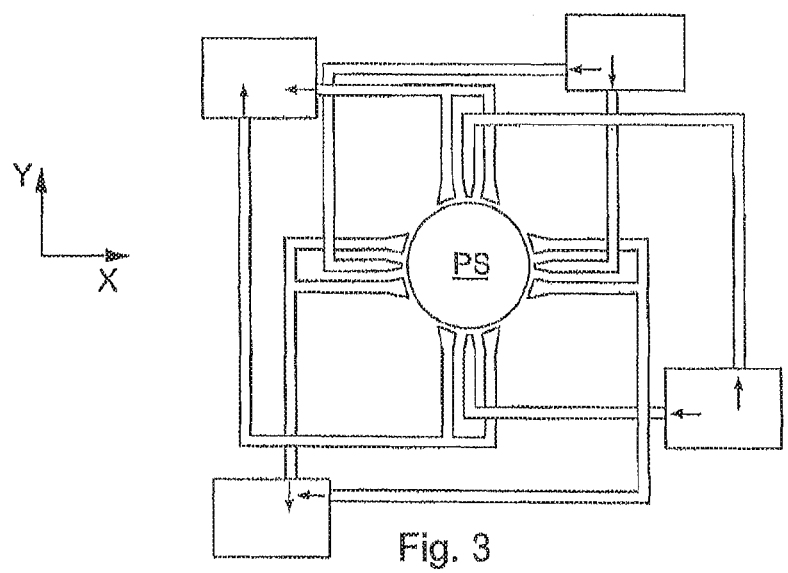

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
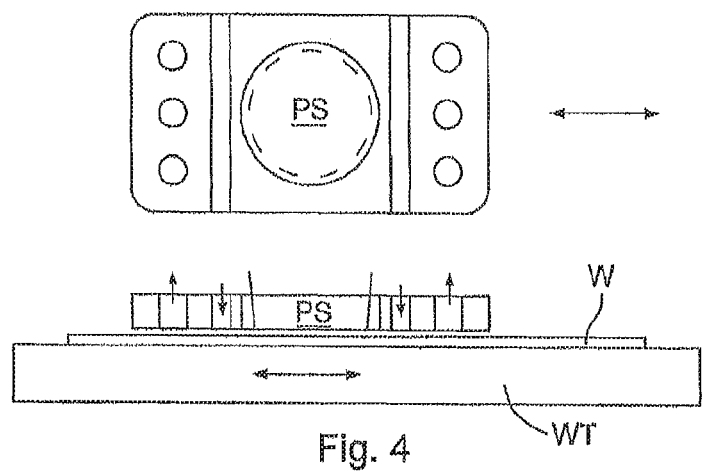
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
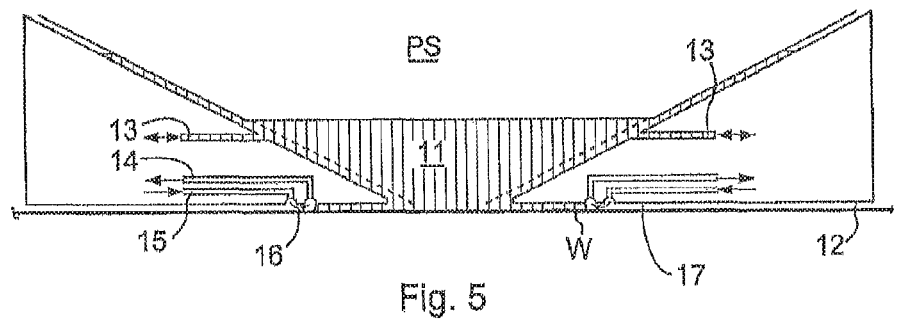
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. of a table, such as substrate table WT, or a substrate W which may be supported by the substrate table. The table may have a cover plate which may serve as the facing surface). (Please note that reference in the following text to the surface of the substrate W also refers in addition or in the alternative to a surface of the substrate table WT, unless expressly stated otherwise.) The liquid confinement structure 12 may be substantially stationary relative to the projection system PS in the XY plane. The liquid confinement structure 12 may move relative to the projection system in the Z direction (e.g. in the direction of the optical axis). In an embodiment, a seal is formed between the liquid confinement structure 12 and the facing surface. The seal may be a contactless seal such as a gas seal (such a system with a gas seal is disclosed in United States Patent Application Publication No. US 2004-0207824) or liquid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid may be provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by the contactless seal, e.g. gas seal 16, which, during use, may be formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States Patent Application Publication No. US 2004-0207824, which is hereby incorporated by reference in its entirety. In another embodiment, the liquid confinement structure 12 does not have a gas seal.

Other types of liquid confinement structure to which an embodiment of the present invention may be applied include the so called gas drag liquid confinement structure such as that described in U.S. patent application Ser. No. 61/181,158, filed 26 May 2009, which is hereby incorporated by reference in its entirety. United States Patent Application Publication No. US 2008/0212046 provides further details and its content is also hereby incorporated by reference in its entirety.

The example of FIG. 5 is a so called localized area arrangement in which liquid is only provided to a localized area of the top surface of the substrate W at any one time. Other arrangements are possible for example, an arrangement using a single phase extractor on the under-surface 17 of the liquid confinement structure 12 may be used. An extractor assembly comprising a single phase extractor with a porous member is described in United States Patent Application Publication No. US 2006/0038968, incorporated herein in its entirety by reference. An arrangement in which such an extractor assembly is used in combination with a recess and a gas knife is disclosed in detail in United States Patent Application Publication No. US 2006/0158627 incorporated herein in its entirety by reference. The extractor assembly may additionally or alternatively comprise a dual phase extractor.

An embodiment of the invention may be applied to a fluid handling structure used in an all wet immersion apparatus. In the all wet embodiment, fluid is allowed to cover substantially all of the substrate and all or part of the whole of the top surface of the substrate table, for example, by allowing liquid to leak out of a confinement structure which confines liquid to between the final element of projection system and the substrate. An example of a fluid handling structure for an all wet embodiment can be found in United States Patent Application Publication No. US 2010/0060868.

Surfaces of the immersion space defined above can experience contamination, for example, through evaporation of droplets of immersion liquid. In particular, the fluid handling structure and substrate table WT are susceptible to experiencing a build up of contamination if the contamination is not removed promptly. Indeed, any surface of the immersion system that is exposed to immersion liquid can experience contamination. Cleaning of these surfaces is therefore desirable in order to prevent build up of contamination beyond an acceptable level.

Cleaning methods may involve the use of a highly oxidizing cleaning material. Examples of cleaning material include ozone, hydrogen peroxide, soap, organic solvent, alkaline liquid and/or ammonia. These cleaning materials may have one or problems associated with them. For example, there is a risk of damage to a component surface. Furthermore, these cleaning materials may require careful handling in order to reduce the potential risk of injury. Further, the cleaning materials may leave deposits on the surfaces to which they are exposed. These deposits may need to be removed before the apparatus can be reused. Rinsing to remove these deposits should be thorough and therefore may take significant time. This may be a particular problem when using an organic cleaning solvent, which is not easily removed by rinsing with water.

A desirable method of cleaning involves injecting a cleaning liquid into the immersion liquid supply that is provided to the space below the final element of the protection system. This cleaning method can be performed in-line. However, this method is limited to dealing with contamination of top-coat material because a cleaning liquid for that purpose does not attack the material used in the liquid handling system. Conversely, cleaning liquid that is capable of dissolving photo resist also corrodes the structure through which the liquid is supplied. For this reason, this method is not effective for contamination by particles of the photo resist layer. Thus, these lithographic apparatuses are not compatible with a cleaning liquid used to deal with photo resist contamination.

A fluid handling structure that is part of a liquid confinement system may be used during a cleaning operation. Cleaning of a surface of the apparatus may be important if the surface is used for, for example, measuring the relative position between a substrate and the illuminating radiation from the projection system. For example, in a lithographic apparatus, a measurement grating that is used in an encoder system for such positional measurements is positioned on the periphery of the substrate table. Hence, during exposure operations, the immersion liquid may run over the measurement grating, which may be covered by a protective cover or coating. As a result, the measurement grating is prone to contamination by, for example, particles and droplets of immersion liquid.

Additionally or alternatively, the fluid handling structure may not be located directly over a substrate, for example during swap of the substrate for another substrate, and may be located over all or part of the measurement grating, thereby possibly causing contamination. As a result of the contamination, position measurements using the grating may fail or be erroneous. Furthermore, when performing a cleaning operation using the fluid handling structure, it is desirable to prevent loss of immersion liquid or cleaning liquid.

When cleaning a surface of a lithographic apparatus using the fluid handling structure, the fluid supplied to the surface is extracted. In some fluid handling structures, a single phase extractor may be used to extract immersion liquid during exposure operation. This single phase extractor may comprise a porous member, otherwise known as a microsieve. When such a fluid handling structure is used during cleaning, the fluid is extracted through the porous member. This can lead to particles or contaminants clogging up the porous member. If this happens, the porous member may need to be cleaned off-line using a cleaning tool such as a megasonic transducer cleaner. Inevitably, this involves some maintenance down-time.

Further, if the gap between the bottom of the porous member and the surface to be cleaned is narrow, the amount of cleaning liquid that can be pumped into the gap is limited. This can limit the effectiveness of the cleaning and it may take longer to achieve the desired level of cleanliness. As mentioned previously, it is undesirable for fluid to be lost. During a cleaning operation, there is relative movement between the fluid handling structure and the surface to be cleaned. Unless the meniscus is precisely controlled, fluid loss is inevitable.

The cleaning fluid used during a cleaning operation may follow the same flow path as the immersion liquid during an exposure operation. Typically, the liquid may be supplied to the space below the projection system, flow radially outward through the gap between the fluid handling system and the facing surface (e.g. substrate and/or table) and then be extracted by an extractor. The extractor is typically a single phase extractor comprising a porous member. Contaminants may build up in or on the porous member.

One possibility for preventing or reducing the accumulation of contamination in or on a porous member of a fluid handling structure is to pump cleaning liquid through the porous member in reverse during cleaning. Hence, the single phase extractor (e.g. microsieve) is adapted to supply or extract liquid depending on the type of operation. During cleaning, immersion liquid and/or cleaning liquid may be pumped in reverse through the porous member towards the surface to be cleaned. That is, the extractor used to extract immersion liquid during exposure operation is used in reverse to pump cleaning liquid through the porous member towards the surface to be cleaned.

However, using this apparatus, the flow in the gap below the projection system is always in the same direction, typically radially outward from the center. Therefore, particles that get stuck on a surface and cannot be moved by flow in that direction will remain on the soiled surface.

Figure 6:
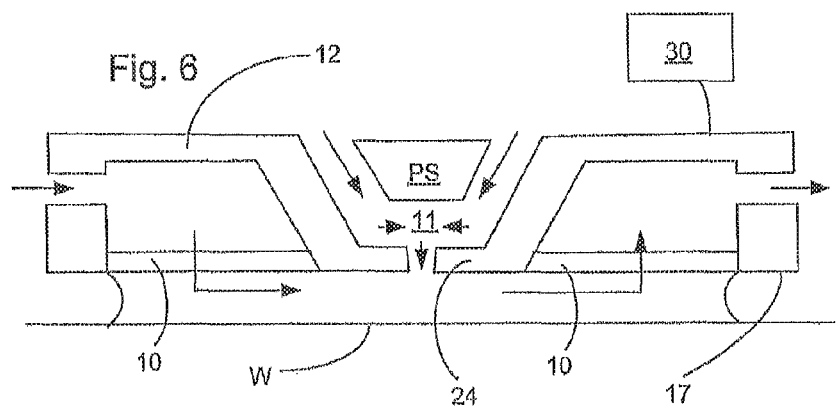
FIGS. 6 and 7 depict a cross-sectional view of a fluid handling system and a controller according to an embodiment of the invention.
Figure 7:
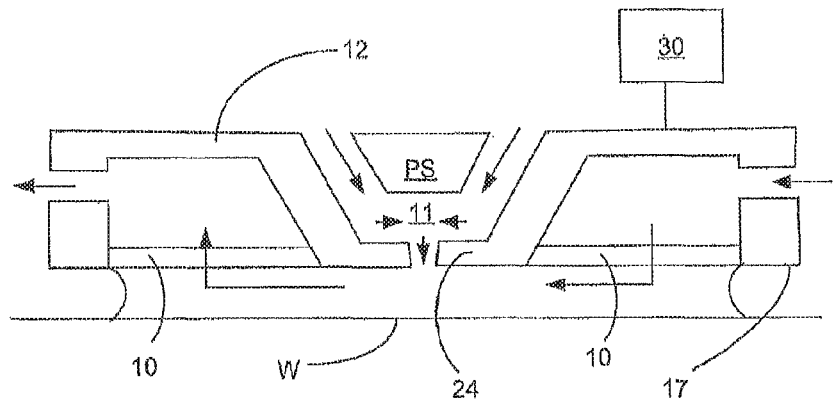

FIGS. 6 and 7 depict schematically a fluid handling system according to an embodiment of the invention. The arrows indicate liquid flow direction. The flow direction in FIGS. 6 and 7 between two openings is opposite, as will be described in more detail below. According to an embodiment, a lithographic apparatus comprises a fluid handling system 12 configured to confine immersion liquid to a space 11 between a final element of a projection system PS and a substrate W and/or a table, and a controller 30. The fluid handling system 12 comprises at least two openings 10 to supply liquid to a gap between the fluid handling system 12 and the substrate W and/or the table and to extract liquid from the gap. The controller 30 is configured to control a direction of liquid flow through the at least two openings 10 such that during a cleaning operation, the directions of liquid flow through at least two of the at least two openings 10 are opposite.

In an embodiment, the fluid handling system 12 comprises at least two openings 10 that are configured, during exposure of a substrate W, to extract immersion liquid from a gap between the fluid handling system 12 and the substrate W and/or the table. The at least two openings 10 are each configured, during a cleaning operation, to be an extraction opening to extract liquid or a supply opening to supply a cleaning liquid. The controller 30 is configured to control a direction of liquid flow through the at least two openings 10 such that during the cleaning operation, at least one opening is a supply opening supplying the cleaning liquid and at least one opening is an extraction opening extracting liquid.

The at least two openings 10 may be positioned at different radial positions. In other words, one of the openings 10 may be positioned radially outward from another of the openings 10. In an alternative embodiment, the at least two openings 10 have the same radial position. This means that the at least two openings 10 are at the same distance from the final element of the projection system PS. In this case, the openings 10 are at azimuthally different positions. This means that the openings 10 are positioned at different points around the circumference of a circle centered on the projection system PS.

In an embodiment, the direction of liquid flow through the at least one supply opening 10 and the at least one extraction opening 10, during the cleaning operation, are opposite. In an embodiment, the direction of liquid flow is across the space 11, substantially parallel to a surface of the table and/or substrate W. In an embodiment, the openings 10 form a closed loop on an under-surface 17 of the fluid handling system. This loop forms a line on the under-surface 17. This line, defined by the openings 10, may be continuous or discontinuous.

In an embodiment, the flow of cleaning liquid (which may be mixed with immersion liquid) in the gap may be "switched" such that the flow direction changes, thereby to clean the parts of the lithographic apparatus effectively. An advantage of switching the flow direction of the cleaning liquid is that it helps to protect the final element of the projection system from the cleaning liquid and/or contaminants by maintaining a flow away from the final element. A further advantage of switching flow is that the cleaning liquid is most effective at "attacking" the contaminants at the opening 10 when that opening is supplying the cleaning liquid. When "switched", the other openings benefit from this effective cleaning.

An embodiment enables this "switching" by providing a fluid handling system 12 that has at least two openings 10 capable of flow in two directions. In an embodiment, at least one of the at least two openings 10 corresponds to an extractor. In particular, at least one of the at least two openings 10 may be a single phase extractor, that is, an extractor which only extracts one phase i.e. liquid (e.g. a microsieve), a needle liquid extractor or a dual phase extractor, for example.

In the same embodiment, another of the at least two openings 10 may be another extractor, a different compartment of the same extractor or may not be an extractor at all. For example, the opening may be an opening that is used to supply liquid to the gap between the fluid handling system 12 and the surface to be cleaned.

In general, the openings 10 may be formed by adapting an inlet or an outlet of the fluid handling system 12 such that the opening 10 may be used to perform the functions of both supplying liquid to, and extracting liquid from, the gap. The openings 10 may be adapted from different inlets or outlets of the same type, from different types of inlets or outlets or from segmented compartments of the same inlet or outlet.

In an embodiment, the openings 10 are formed by providing a segmented supplier/extractor with at least two compartments. In this case, one of the compartments may supply liquid while another compartment extracts. In contrast, the single phase extractor of a typical system is connected internally in the fluid handling system. In other words, all parts of the extractor are connected to the same under pressure. Hence, it is not possible to supply liquid through one portion of the extractor and extract fluid from another portion of the extractor.

In an embodiment, there are two openings 10 corresponding to two compartments of a supplier/extractor. Each compartment comprises an opening to supply liquid to the gap between the fluid handling system 12 and the substrate W and/or table and to extract liquid from the gap.

In an embodiment, there are four openings 10 corresponding to four compartments of a supplier/extractor. In this case, one compartment may supply liquid while the other three compartments extract. The number of compartments is not particularly limited and may be even or odd. Given the number of compartments, the arrangement as to which compartment(s) supplies liquid and which extracts liquid is only limited to the extent that at least one of the openings supplies liquid while at least one of the openings extracts liquid.

The cleaning liquid that is extracted from the gap may not be pure cleaning liquid. This is because during a cleaning operation, immersion liquid may be continually supplied to the space directly under the final element of the projection system. This causes the cleaning liquid to be diluted by the immersion liquid. One of the purposes of supplying immersion liquid to the space underneath the final element of the projection system PS is to help prevent the cleaning liquid from damaging the final element of the projection system, The flow of immersion liquid creates a positive pressure that decreases contact between the cleaning liquid and the final element. As a result, the cleaning liquid that is extracted from the gap may be diluted with immersion liquid.

This method of cleaning using "switched" flow may be used to clean a substrate W or a table of the lithographic apparatus, or to clean the fluid handling system 12 itself.

During an exposure operation, the openings 10 that are used for the "switched" flow are desirably set to extraction mode. In order to effect this, the above-mentioned controller 30 is optionally further configured to control the direction of liquid flow through the at least two openings 10 during an exposure operation such that the at least two openings 10 extract liquid from the gap.

In an embodiment, the controller 30 is configured to control a direction of liquid flow through the gap, so that at least a part of the liquid flow passes between the projection system PS of the lithographic apparatus and the surface of the substrate W and/or table. Ensuring that liquid flows between the projection system PS of the lithographic apparatus and the surface of the substrate W and/or table improves cleaning of the fluid handling system 12.

In particular, there may be a flow plate that partially separates the space below the final element of the projection system PS and the gap. This flow plate 24 may comprise through holes to reduce the liquid pressure acting on the flow plate 24 by allowing some of the liquid to pass through the holes. These holes may become clogged by contaminants. These contaminants may be removed by the flow of liquid across the gap.

In order to help ensure that the flow passes through the gap under the space 11, the fluid handling system 12 may have at least two supply openings 10 of which an upstream opening is formed upstream of the liquid passing through the gap and a downstream opening is formed downstream of the liquid passing through the gap. Such a configuration is depicted in FIGS. 6, 7 and 8. In FIGS. 6 and 8, the opening 10 on the left hand side of the drawing is the upstream opening and the opening 10 on the right hand side of the drawing is the downstream opening. In FIG. 7, the roles of the openings 10 are reversed. Liquid that passes through both openings passes through the gap directly below the space 11.

In these embodiments having upstream and downstream openings 10, the controller 30 may be configured to control the downstream opening to supply liquid and the upstream opening to stop supplying liquid, depending on the desired direction of flow. In other words, the roles of the upstream and downstream openings 10 are determined by the controller in order to effect liquid flow through the gap below the space 11 in a particular direction.

There may be an external extractor 40 radially outward of these openings to induce flow in a particular direction through the gap. Such an external extractor is depicted in FIG. 8.

In an embodiment, there are at least two external extractors 40 radially outward of the supply openings 10. At least two external extractors 40 are positioned on opposing sides of the immersion space 11. The controller 30 is optionally configured to control at least one external extractor 40 to extract liquid and to control another at least one extractor 40 on an opposing side of the space to stop extracting. Such an embodiment is depicted in FIG. 8. The dashed arrow represents the potential flow of liquid through one of the external extractors. Specifically, liquid flows when the extracted is controlled to be on by the controller 30 but does not flow when the extractor is controlled to be off by the controller 30. The controller 30 performs this control depending on the desired direction of flow of liquid.

Analogous to the control of the openings 10 described above, the controller 30 may be configured to control the function of the two or more openings 10 to function as upstream and downstream openings dependent on the position of the supplying opening to the liquid flow, in use, between the projection system PS and the surface of the substrate W and/or table. That is, if an opening is downstream of the liquid flow through the gap beneath the space 11, it is controlled to function as an extraction opening. Alternatively, if an opening is upstream of the liquid flow, it is controlled to function as a liquid inlet supplying liquid to the gap.

In an embodiment, the part of the liquid flow which passes between the projection system PS and the surface of the substrate W and/or table, passes through a path of the patterned beam of radiation. Optionally, the fluid handling system 12 has an under-surface 17. Optionally, the one or more supply openings are formed in the under-surface 17. Optionally, the one or more extraction openings are formed in the under-surface 17. Of course, the extraction opening(s) may be of any type, such as a needle liquid extractor, a microsieve, or a dual phase extractor.

The substrate W may be replaced by a dummy surface. Such a dummy surface may be used when replacing one substrate W with another. The dummy surface is used to prevent liquid from escaping from the fluid handling system. If this happens, the projection system may undesirably get drying stains.

The table may be the surface of a substrate table WT, a measurements table and/or a shutter member. The shutter member may be used as a dummy surface. The shutter member/dummy surface may comprise at least one liquid extractor configured to remove any liquid not recovered by the fluid handling system 12. The measurement table may be a part of a system to measure a property of the projection system PS.

As mentioned above, the openings used for switched flow may be compartments of a single phase extractor (adapted to be capable of supplying liquid in addition to extracting liquid), that is, for example, an extractor that comprises a porous member. In this case, the lithographic apparatus optionally further comprises a porous member through which the liquid flows when supplied and when extracted via at least one of the at least two openings 10.

However, other types of opening may be used and the porous member is not necessary. In particular, one or more of the openings may be needle liquid extractors. Such needle liquid extractors may be positioned so as to surround the space below the projection system PS.

FIG. 8 depicts an embodiment including an outer cleaning extractor 40. This embodiment is the same as the embodiment depicted in FIGS. 6 and 7 except for the following description. In this embodiment, the fluid handling system further comprises an extractor 40 radially outward of the at least two openings 10. The purpose of this extractor 40 is to help prevent the cleaning liquid in the gap from escaping. Desirably, the controller 30 of the lithographic apparatus is further configured to control the extractor 40 such that it only extracts during a cleaning operation.

This extractor 40 may be termed the cleaning extractor 40. The dotted arrow in FIG. 8 represents the extraction of any liquid that may otherwise be lost. The extractor 40 may take the form of a slit. The extractor 40 may comprise a plurality of openings encircling the at least two openings 10.

During normal operation, immersion liquid may be provided to the space below the final element of the projection system PS at a position radially inward of the porous member and extracted through the at least two openings 10. In this case, the meniscus of the immersion liquid is radially inward of the cleaning extractor 40. Hence, the cleaning extractor 40 is not necessary during normal exposure operation because the immersion liquid during an exposure operation is extracted before it reaches the cleaning extractor 40.

However, during cleaning, the cleaning extractor 40 is used to extract fluid that is provided to the gap between the fluid handling system 12 and the surface to be cleaned via one or more openings radially inward of the porous member and via the porous member itself. In an embodiment, the cleaning extractor 40 is optimized for cleaning a surface of the lithographic apparatus, rather than being optimized for scanning. In practice, this may mean that the cleaning extractor 40 is configured and arranged to limit contamination of the surface over which the fluid handling system 12 is located by extracting all of the fluid from the gap. Another way in which the extractor may be optimized for cleaning is arranging the extractor 40 such that its opening(s) is larger than those of the at least two openings 10 used for switching flow. This helps to prevent the extractor 40 from getting clogged up with particles.

By extracting fluid and contaminants from the gap, the cleaning extractor 40 may pin the meniscus of fluid in the gap. This allows more precise meniscus control than is the case when all of the fluid is extracted via the porous member. This has a beneficial effect that cleaning may be more accurately controlled such that a surface that is to be cleaned (for example a measurement grating) may be cleaned right up to its edge without liquid loss, e.g., down its side.

FIGS. 9 and 10 depict a plan view of one possible configuration of a single phase type extractor segmented such that there are four openings used for switched flow. These openings correspond to four compartments of a segmented single phase extractor 10 that has been adapted to be able to supply liquid to the gap in addition to being able to extract liquid from the gap. It will be appreciated that for embodiments in which there are more than two openings used for switch flow, the flow may not necessarily flow in opposite directions for each possible pairing of openings. Of course, the openings 10 need not correspond to a microsieve or any other single phase extractor/supplier. The openings 10 may be configured to supply and extract dual phase fluids.

In FIGS. 9 and 10, the arrows indicate flow direction. In both Figures, liquid is supplied to the gap through a supply channel 18 radially inward of the at least two openings 10. The Figures depict possible patterns of flow between the openings 10. Liquid is supplied to the gap by the opening 10 in which the arrow starts and is extracted from the gap through the opening 10 in which the arrow ends.

Of course other patterns are possible. For example, where there are four openings, one of the openings may supply liquid while three openings extract liquid. The number of openings need not be limited to four. It may be five, six, seven etc. The more openings there are, the greater the number of possible patterns for flow switching.

FIG. 11 depicts an embodiment in which the at least two openings 10 are connected to both a supply line 80 to supply liquid to the gap through that opening and an extraction line 90, separate from the supply line 80, to extract liquid from the gap through that opening. In other words, there are separate pipes for the functions of supply and extraction of liquid passing through the openings.

FIG. 12 depicts an embodiment in which the at least two openings 10 are connected via a single line from a recess 19 in the fluid handling system 12 connected to the opening, wherein that one line is connected to supply and extraction lines. This connection and control of the lines may be effected by a three-way valve 21. This embodiment has an advantage of taking up less space than the embodiment depicted in FIG. 11.

Typical cleaning liquids for use in cleaning a surface that is exposed to immersion liquid include a solution containing hydrogen peroxide and/or a solution containing ozone. Alkaline liquids or ammonia may be used. If the concentration of ozone and/or hydrogen peroxide in the cleaning agent is above a certain level, then damage may occur to the surface being cleaned. However, cleaning liquid that is capable of dissolving photo resist is needed to remove contaminants that comprise particles of photo resist. That is, in order to adequately remove contaminants from surfaces of a lithographic apparatus, it is desirable to use a corrosive cleaning liquid. However the downside of using such a corrosive fluid is that it corrodes the cleaning apparatus itself.

The liquid supply or extraction lines used in a fluid handling system 12 can be damaged by use of such cleaning liquid. Additionally, O-rings used to connect these lines to the fluid handling structure may be damaged by these fluids. The supply and extraction lines should be flexible in order to reduce transmission of vibrations in the lithographic apparatus. As such, polymers that are not resistant to corrosive cleaning liquid have been used. Hence, less effective cleaning liquid had to be used.

According to an embodiment, there is provided a lithographic apparatus comprising a fluid handling system 12 configured to confine immersion liquid to a space 11 between a final element of a projection system PS and a substrate W and/or a table. The fluid handling system 12 comprises a liquid supply or extraction line configured to supply cleaning liquid to, or extracting cleaning liquid from, the fluid handling system 12. An inner surface of the liquid supply or extraction line is desirably made of a material that is flexible and resistant to corrosion by an organic liquid. The organic liquid may be, for example, a solvent or a soap. Desirably, the material is resistant to corrosion by an alkaline liquid and/or ammonia used as a cleaning liquid.

In an embodiment, the inner surface of the liquid supply or extraction line is resistant to corrosion by a fluid for dissolving photo resist. Such a fluid for dissolving photo resist is useful for removing contaminants from the photo resist layer of a substrate. By the liquid supply or extraction lines being resistant to corrosion by such a fluid, the fluid handling system is compatible with such a cleaning fluid and may therefore be used for photo resist contamination cleaning operations. Desirably, the inner surfaces are flexible.

Examples of cleaning fluids that are suitable for dissolving photo resist include a ketone, such as cyclohexanone, diacetone alcohol and/or acetone; an ester, such as methyl lactate, ethyl lactate, ethyl acetate and/or gamma butyrolactone; and/or a glycol ether, such as diethylene glycol butyl ether (DEGBE).

According to an embodiment, a flexible polymer material that is chemically inert, such as PTFE and PFA, and/or type 316L stainless steel may be used for the inner surface(s) of liquid supply and/or extraction lines. Other flexible metal piping may be used, such as piping made of a high nickel alloy. The flexible metal piping may be helically corrugated, annularly corrugated or helically crest welded. The metal piping may be single ply or multi-ply. The materials mentioned above are only exemplary. Other materials that are corrosion-resistant and may be formed into a flexible line may be used.

In an embodiment, the liquid supply or extraction line is connected to the liquid supply or extraction opening by a connector made of a material that is resistant to corrosion by an organic solvent. The connector may be, for example, an 0-ring.

FIG. 13 schematically depicts an embodiment in which the fluid handling system 12 comprises, radially outward of at least one opening 10, a liquid supply opening 25 configured to supply liquid to the gap. The at least one opening 10 performs the same function as the at least two openings described in relation to the embodiments depicted in FIGS.

6 and 7. That is, the at least one opening may be used to either supply liquid to the gap, or to extract liquid from the gap. FIG. 13 depicts two openings 10. These openings may be separate openings. Alternatively, they may be part of a single opening. In this case, the single opening may be annular.

In an embodiment, the liquid supply opening 25 is positioned radially inward of the outer extractor 40 (if the outer extractor 40 is also present in the embodiment). This liquid supply opening 25 may supply immersion liquid or cleaning liquid.

The embodiment depicted in FIG. 13 is advantageous for operations cleaning a table with the fluid handling system. Even in the case that liquid that passes through the at least one opening 10 passes through a porous member, the table may be cleaned without the porous member becoming clogged by particles or contaminants.

In an embodiment, during the cleaning operation, the controller 30 controls relative movement between the fluid handling structure and the surface that it is cleaning such that the cleaning liquid, which is supplied through the at least one opening 10, is substantially isolated from the final element of the projection system. This may be achieved by ensuring that the cleaning liquid flows in a direction radially outwards from the at least one opening 10. This avoids the cleaning liquid from contacting the final element of the projection system, for which the cleaning fluid would have to travel radially inward from the at least one opening 10.

Radially outward (as opposed to inward) flow of cleaning liquid may be ensured by the flow of a liquid other than cleaning liquid supplied by one or more openings positioned radially inward of the at least one opening 10. This additional flow prevents radially inward flow of cleaning liquid. Additionally or alternatively, the controller 30 may control the relative movement between the fluid handling structure and the surface such that the relative speed does not exceed a certain threshold. The reason for this is that if the relative speed is too great, the cleaning liquid in the gap between the structure 12 and the surface may reach the space 11 beneath the final element of the projection system PL.

Figure 14:
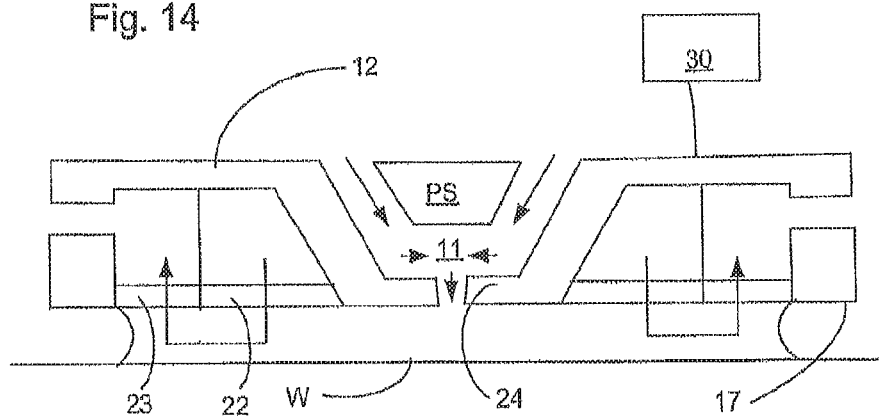
FIG. 14 depicts a cross-sectional view of a fluid handling system and a controller according to an embodiment of the invention.

FIG. 14 depicts a further variation of an embodiment of the invention. This embodiment may have the features of the embodiments depicted in FIGS. 6 to 13, except for the following description. In this embodiment, the at least two openings 22, 23 that are used for switched flow have different radial positions in the fluid handling system 12. Specifically, as depicted in FIG. 14, opening 22 is radially inward of opening 23. As such, these openings, which are analogous to the at least two openings 10 described above in relation to FIGS. 6 to 8, have different radial positions.

The embodiment depicted in FIG. 14 comprises at least two openings 22, 23 for switched flow. Of course, as mentioned previously, the openings may alternatively have the same radial positions but differ azimuthally in position.

Thus, in an embodiment, the fluid handling system 12 comprises two surfaces, of which a radially inner surface 22 is formed around an optical path of the patterned beam of radiation and a radially outer surface 23 is formed at an outer side of the radially inner surface. The two surfaces are configured, during exposure of a substrate W, to extract immersion liquid from a gap between the fluid handling system 12 and the substrate W and/or the table and are configured, during a cleaning operation, to be an extraction surface to extract liquid or a supply surface to supply a cleaning liquid. The controller 30 is configured to control the two surfaces 22, 23 such that during the cleaning operation, one surface is a supply surface and the other surface is an extraction surface.

The two surfaces are optionally stepped such that there are two levels, each level corresponding to one of the surfaces at a different height (i.e. gap width) above the surface of the substrate or table over which the fluid handling system 12 is located. Alternatively, the two surfaces 22, 23 may be arranged at the same level, as depicted in FIG. 14. The surfaces are part of a liquid supplier/extractor that may comprise a porous member (e.g. a microsieve).

During a cleaning operation, cleaning liquid may be supplied through the radially inner of these two surfaces and extracted through the radially outer of the two surfaces. The flow may be switched such that fluid is supplied through the radially outer surface and extracted through the radially inner surface.

According to one proposed method for cleaning a surface (such as a grating), contaminants are detected using a level sensor and the fluid handling structure is used to clean the surface. Alternatively or additionally, there may be a separate sensor dedicated to detecting contaminants. A level sensor and/or a separate sensor dedicated to detecting contaminants may be used to detect contaminants on a surface.

In an embodiment, a surface may be cleaned periodically. A periodic cleaning system may be implemented according to an embodiment without needing a large amount of downtime. This is because using an embodiment of the invention, cleaning may be performed in-line.

Figure 15:
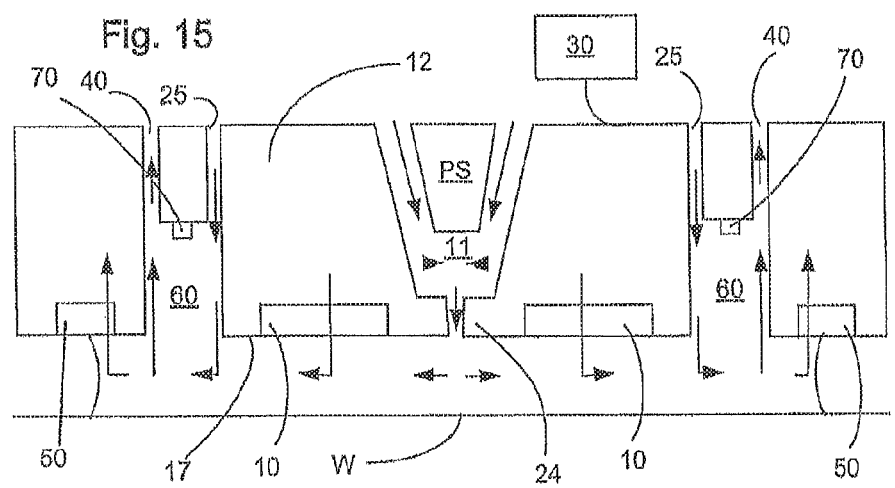
FIGS. 15 and 16 depict a cross-sectional view of a fluid handling system and a controller according to an embodiment of the invention.
Figure 16:
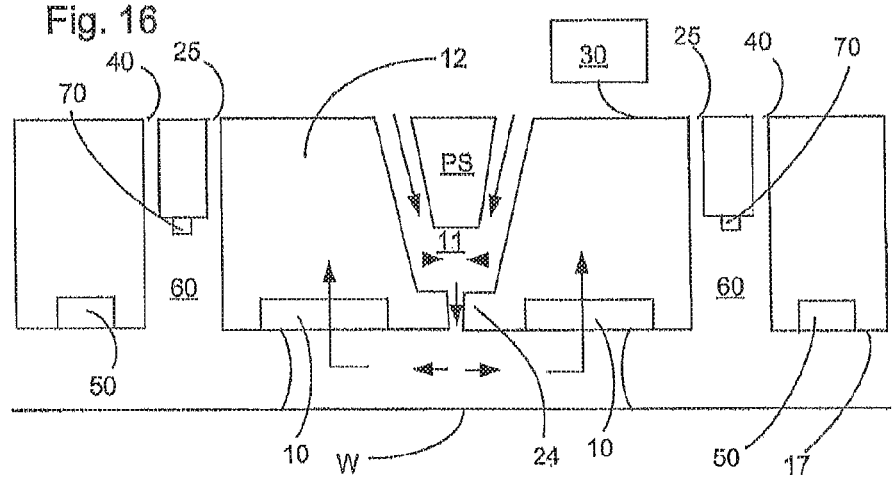

A further embodiment, depicted in FIGS. 15 and 16, provides a lithographic apparatus comprising a fluid handling system 12 and a controller 30. This embodiment is the same as the embodiment described with respect to FIGS. 6 to 12, except for the following description. The fluid handling system 12 comprises a liquid opening 10 and a supply opening 25. The liquid opening 10 is configured to supply liquid to a gap between the fluid handling system 12 and a substrate W and/or a table, and to extract liquid from the gap. The supply opening 25 is radially outward of the liquid opening 10. The supply opening 25 is configured to supply liquid to the gap. Hence, there is one opening that is capable of flow in both directions (i.e. for both supply and extraction of fluid) and another opening that need only be capable of the supply function. The controller 30 is configured to control a direction of liquid flow through the liquid opening 10.

The liquid opening 10 of this embodiment is similar to the at least two openings 10 previously described. That is, during an exposure operation, the liquid opening 10 may extract immersion liquid that is supplied to the gap radially inward of the liquid opening 10. During a cleaning operation, the liquid opening 10 may supply cleaning liquid to the gap.

Optionally, the fluid handling system 12 further comprises an extractor 40 radially outward of the supply opening 25. The extractor 40 is configured to extract gas and/or liquid from the gap. This extractor 40 helps to pin the meniscus, thereby preventing liquid loss. To this end, the controller 30 may be configured to control the extractor 40 such that substantially no liquid escapes the gap.

Optionally, as depicted in FIGS. 15 and 16, the fluid handling system 12 further comprises a further extractor 50 radially outward of the above-mentioned extractor 40, the further extractor 50 being configured to extract liquid from the gap. This further extractor 50 helps to control the meniscus during cleaning. In an embodiment, the further extractor 50 comprises a porous member. In an embodiment, the further extractor 50 may be a dual phase extractor 50 configured to extract both gas and liquid from the gap, thereby to pin the meniscus.

FIGS. 15 and 16 depict an embodiment in which the further extractor 50 is particularly useful. FIG. 15 depicts the fluid handling system 12 during a cleaning operation. FIG. 16 depicts the fluid handling system 12 during an exposure operation. In this embodiment, the fluid handling system 12 further comprises a recess 60 in an under-surface 17 of the fluid handling system 12. The recess 60 is positioned radially outward of the supply opening 25. In an embodiment, the lithographic apparatus further comprises a megasonic transducer 70 configured to clean a surface of an object. The transducer 70 may be positioned within the recess 60. Using the transducer 70, megasonic waves are introduced into a liquid on the surface to clean the surface. The use of a megasonic transducer 70 is particularly advantageous for cleaning of a table.

In an embodiment, the controller 30 of the lithographic apparatus is configured to control the direction of liquid flow through the liquid opening 10 such that, during a cleaning operation liquid is supplied to the gap through the liquid opening 10 and, during an exposure operation, liquid is extracted from the gap through the liquid opening 10.

Optionally, the liquid opening 10 is connected to both a supply line configured to supply liquid to the gap through the liquid opening 10 and an extraction line, separate from the supply line, configured to extract liquid from the gap through the liquid opening 10. As described above, in an embodiment, an inner surface of the supply line and an inner surface of the extraction line are made of a material that is flexible and resistant to corrosion by an organic solvent.

The liquid opening 10 mentioned above for supply of immersion liquid and/or extraction of fluid may be located radially inward of the supply opening 25. This liquid opening 10 may be used for the supply of immersion liquid to the space directly below the final element of the projection system.

Optionally, a porous member is provided through which liquid flows when supplied and when extracted via the liquid opening 10. Such a porous member may be used to allow the liquid opening 10 to be used a single phase extractor, extracting liquid but not gas. Alternatively, a dual phase extractor may be used. The porous member may be formed by a piece of porous material. Alternatively, the porous member may be formed by machining a series of holes in an under-surface 17 of the fluid handling system 12.

Optionally as depicted in FIG. 5, an immersion liquid supply opening 13 is configured to supply immersion liquid to the space 11. This immersion liquid supply opening 13 may be applied to any of the embodiments depicted in FIGS. 6 to 19. This immersion liquid supply opening 13 may be formed in a surface of the fluid handling system 12 that confines immersion liquid to the space. In this way the immersion liquid can dilute the cleaning liquid as it passes between the projection system PS and the surface of the substrate W and/or table. Additionally, the cleaning liquid is prevented from contacting the surface of the projection system PS.

In an embodiment, the lithographic apparatus comprises an immersion liquid controller 30 configured to control the supply of immersion liquid through the immersion liquid supply opening 13 such that during a cleaning operation an immersion liquid flows across the surface of the projection system PS that in part forms the space 11.

Optionally, the fluid handling system 12 comprises a confinement structure which surrounds the space to confine the immersion liquid to the space.

One potential problem with using a fluid handing system 12 for cleaning a surface of a lithographic apparatus is that it is possible in some circumstances for the cleaning liquid to come into contact with the final element of the projection system PS, which is in close proximity to the liquid confinement structure of the fluid handling system 12. If this happens, the cleaning liquid may damage the final element of the projection system PS. Accordingly, it is desirable to prevent this from happening.

Therefore, the lithographic apparatus according to any of the embodiments described herein may further comprise a protection arrangement configured to prevent cleaning liquid from contacting the final element of the projection system PS. In an embodiment, the protection arrangement prevents contact between cleaning liquid supplied to the gap and immersion liquid supplied to the space 11. Alternatively, the cleaning liquid and the immersion liquid may come into contact with each other.

There are various structural ways in which this protection feature may be embodied. Examples of such structures are detailed below.

In an embodiment, the protection arrangement comprises a final element liquid supply opening 13 as depicted in FIGS. 5 and 17 configured to supply immersion liquid to the space below the final element, and a controller 30 configured to control the final element liquid supply opening such that during a cleaning operation there is a flow of immersion liquid across the final element in the space. In this way, the cleaning liquid may be sufficiently diluted by the immersion liquid in the space such that the diluted mixture does not cause damage to the final element. The flow of immersion liquid may prevent the cleaning liquid from reaching the element. The concentration of cleaning liquid may decrease towards the final element of the projection system PS such that at the element itself, there is substantially no cleaning liquid.

Additionally or alternatively, as depicted in FIGS. 5 and 17, the protection arrangement may comprise a final element liquid supply opening 13 configured to supply immersion liquid to the space 11 and a controller 30 configured to control the supply of immersion liquid through the final element liquid supply opening 13 such that during a cleaning operation, immersion liquid is supplied by the final element liquid supply opening at a higher pressure than the cleaning liquid is supplied to the gap. This protects the final element of the projection system PS by providing a relatively strong flow of liquid away from the final element.

Additionally or alternatively, the protection arrangement may comprise a closing disk configured to provide a lower confining surface of the space and a device configured to create and maintain a gap between the fluid handling system 12 and the closing disk. This gap may be maintained by a gap liquid supply. The gap liquid supply may create the pressure sufficient for a liquid bearing, thereby preventing the gap between the closing disk and the under-surface 17 of the fluid handling system 12 from closing.

FIG. 17 shows an orientation of the fluid handling system 12 and closing disk. An outlet 14 connected to an under pressure is used to urge the closing disk 20 against the fluid handling system 12. If the closing disk 20 is urged to contact the liquid confinement system 12 by outlet 14, particulate contamination of the immersion liquid may occur because of particles being released from the surface of either the closing disk 20 or the fluid handling system 12 predominantly initiated by their physical contact.

FIG. 17 shows the closing disk 20 being maintained at a set distance from the fluid handling system 12. In this way, there are at least two advantages. First is that particles are unlikely to be released from the surfaces of either the closing disk 20 or the liquid confinement system 12. Second, any particles which are present in immersion liquid 11 are removed by the circulation of the liquid, particularly via outlet 14.

There are several ways in which the closing disk may be held a distance away from the fluid handling system 12. One is by maintaining an equilibrium state between the outlet 14 and gas flow 15 as shown in FIG. 5. This equilibrium may be used not only to contain the immersion liquid 11, but also to cause the closing disk to "float" just below the liquid confinement system.

Instead of the closing disk, the protection arrangement may comprise a shutter member placed within the fluid handling system 12 and positioned on a side of the space opposite the projection system PS such that the liquid can be confined in the space and between the projection system PS and the shutter member. The shutter member may be retractable in the fluid handling system 12.

An embodiment of the shutter member is illustrated in FIG. 18. It allows the substrate table WT to be moved completely away from the projection system PS and liquid confinement structure 12 for the substrate W to be removed from the substrate table WT and a new substrate W to be placed on the substrate table WT. Thus it can be used, for example, with dual stage machines.

A shutter member 150 is in the form of a plate with a primary cross-sectional area larger than that of the localized area or aperture in the fluid handling system 12. The shape of the shutter member 150 may be any shape so long as it covers the aperture. The shutter member 150 is not a substrate and is movable relative to both the substrate table WT and the fluid handling system 12 and may be attached to the fluid handling system 12 by any means, for example by vacuum clamping or magnetically.

The shutter member 150 is arranged to prevent liquid flow between the space below the final element and the gap. The shutter member 150 is also arranged such that it does not seal the inlets and outlets on the under-surface 17 of the fluid handling system 12. This enables cleaning to be performed in the gap without cleaning liquid entering the space.

Additionally or alternatively, the protection arrangement may comprise a flow plate substantially parallel to the substrate or the substrate table to divide the space into two parts, the plate having an aperture. The purpose of the aperture is to allow a beam of radiation to pass through the aperture from the final element of the projection system to a substrate below the fluid handling system.

Additionally or alternatively, as depicted in FIG. 18, the protection arrangement comprises a liquid level sensor 32 configured to monitor a level of liquid in the space, and a level controller 33 configured to control the supply of liquid during a cleaning operation such that the level of liquid does not exceed a certain level.

FIG. 19 depicts a flow plate according to an embodiment of the invention for protecting the final element of the projection system PS of the lithographic apparatus. The flow plate additionally has the beneficial effects of preventing or reducing transportation of contaminants from the resist and/or topcoat on the substrate and temperature gradients in the immersion liquid, e.g. ultra pure water. The plate 24 is provided to divide the space between the projection system PS and substrate W into two parts. The plate 24 has an aperture or window 24a to allow transmission of the radiation beam PB. The aperture or window is slightly larger than the exposure field EF to accommodate the convergence of the beam PB from the projection system PS to the substrate W.

Additionally or alternatively, the protection arrangement comprises pressure supply 34 configured to increase a pressure in the space directly below the final optical element to above atmospheric pressure.

Another way to protect the final element of the projection system from the cleaning liquid is to supply immersion liquid to the space below the final element and use cleaning liquid of a greater density than the immersion liquid. The purpose of this is to prevent the cleaning liquid from rising above the immersion liquid to reach the final element. Specifically, in an embodiment, a cleaning operation is performed by supplying immersion liquid to the space below the final element of a projection system and supplying cleaning liquid that is denser than the immersion liquid to the gap between the substrate and/or table and the fluid handling system. In an embodiment, the immersion liquid and the cleaning liquid are supplied via separate openings. The immersion liquid and the cleaning liquid do not substantially mix with each other.

In an embodiment, the controller 30 controls the supply of immersion liquid to the space such that it flows away from the final element. In this embodiment, the cleaning liquid need not be supplied to the gap by the fluid handling system. It may, for example, be supplied from beneath the surface that is to be cleaned.

Suitable liquids for use as cleaning liquids in this embodiment are those that are able to dissolve photo resist. The cleaning liquid should be chemically compatible with the materials into which it will come into contact. Optionally, the cleaning liquid is supplied to the gap via a porous member. In this case, the cleaning liquid is able to pass through the porous member without clogging and able to be rinsed out of the porous member by immersion liquid in a short timeframe (e.g. less than 30 minutes).

Examples of suitable cleaning liquids that are denser than immersion liquid are gamma-butyrolactone, which has a density of $1,129$ $kgm^{-3}$, and ethyl lactate, which has a density of $1,030$ $kgm^{-3}$. The immersion liquid may be water. Such a combination of immersion liquid and a denser cleaning liquid may be applied to any of the embodiments herein.

As mentioned previously, using the fluid handling system 12 for cleaning the lithographic apparatus, or service thereof, is particularly advantageous in the case of cleaning, for example, a measurement grating. As depicted in FIG. 20, the lithographic apparatus may comprise a reference frame RF, a grating 51 and sensor 52. The grating 51 is attached to either the table WT or the reference frame RF. The sensor 52 is attached to the other. The sensor 52 is configured to detecting radiation diffracted and/or reflected by the grating in order to measure the relative position between the table WT and the reference frame RF. The table may be either a substrate table, as depicted in FIG. 20, or a measurement table.

In an aspect, there is provided a lithographic apparatus comprising a fluid handling system configured to confine immersion liquid to a space between a final element of a projection system and a substrate and/or a table, the fluid handling system comprising at least two openings configured to supply liquid to a gap between the fluid handling system and the substrate and/or the table and to extract liquid from the gap, and a controller configured to control a direction of liquid flow through the at least two openings such that during a cleaning operation, the directions of liquid flow through at least two of the at least two openings are opposite.

In an embodiment, the controller is further configured to control the direction of liquid flow through the at least two openings during an exposure operation such that the at least two openings extract liquid from the gap.

In an embodiment, the lithographic apparatus further comprises a porous member through which the liquid flows when supplied and when extracted via at least one of the at least two openings.

In an embodiment, the fluid handling system further comprises an extractor radially outward of the at least two openings.

In an embodiment, the controller is further configured to control the extractor such that it only extracts during a cleaning operation.

In an embodiment, there are four of the at least two openings.

In an embodiment, at least two openings are connected to both a supply line configured to supply liquid to the gap through that opening and a extraction line, separate from the supply line, configured to extract liquid from the gap through that opening.

In an embodiment, an inner surface of the supply line and an inner surface of the extraction line are made of a material that is flexible and resistant to corrosion by an organic solvent.

In an embodiment, the fluid handling system further comprises, radially outward of the at least two openings, a liquid supply opening configured to supply liquid to the gap.

In an aspect, there is provided a lithographic apparatus comprising a fluid handling system configured to confine immersion liquid to a space between a final element of a projection system and a substrate and/or a table, the fluid handling system comprising a liquid opening configured to supply liquid to a gap between the fluid handling system and the substrate and/or the table and to extract liquid from the gap, and a supply opening, radially outward of the liquid opening, configured to supply liquid to the gap, and a controller configured to control a direction of liquid flow through the liquid opening.

In an embodiment, the fluid handling system further comprises an extractor, radially outward of the supply opening, configured to extract gas and/or liquid from the gap.

In an embodiment, the fluid handling system further comprises a further extractor, radially outward of the extractor, configured to extract liquid from the gap.

In an embodiment, the controller is configured to control the direction of liquid flow through the liquid opening such that, during a cleaning operation, liquid is supplied to the gap through the liquid opening and, during an exposure operation, liquid is extracted from the gap through the liquid opening.

In an embodiment, the fluid handling system further comprises a recess in an under-surface of the fluid handling system radially outward of the supply opening.

In an embodiment, the lithographic apparatus further comprises a megasonic transducer configured to clean a surface of an object, the transducer located within the recess.

In an embodiment, the liquid opening is connected to both a supply line configured to supply liquid to the gap through the liquid opening and an extraction line, separate from the supply line, configured to extract liquid from the gap through the liquid opening.

In an embodiment, an inner surface of the supply line and an inner surface of the extraction line are made of a material that is flexible and resistant to corrosion by an organic solvent.

In an aspect, there is provided a lithographic apparatus comprising a fluid handling system configured to confine immersion liquid to a space between a final element of a projection system and a substrate and/or a table, the fluid handling system comprising a liquid supply or extraction line configured to supply cleaning liquid to, or extract cleaning liquid from, the fluid handling system, wherein an inner surface of the liquid supply or extraction line is flexible and resistant to corrosion by an organic liquid.

In an embodiment, the inner surface of the liquid supply or extraction line is made of a material that is resistant to corrosion by a fluid for dissolving photo resist.

In an embodiment, the inner surface of the liquid supply or extraction line is made of a material selected from a group consisting of PTFE, PFA and Type 316L stainless steel.

In an embodiment, the lithographic apparatus further comprises a second liquid supply or extraction line configured to supply immersion liquid to, or extract immersion liquid from, the fluid handling system, and a controller configured to control whether cleaning liquid is supplied to and/or extracted from the fluid handling system via the liquid supply or extraction line, or whether immersion liquid is supplied to and/or extracted from the fluid handling system via the second liquid supply or extraction line.

In an embodiment, the liquid supply or extraction line is further configured to supply immersion liquid to, or extract immersion liquid from, the fluid handling system, and the lithographic apparatus further comprises a controller configured to control whether cleaning liquid or immersion liquid is supplied to and/or extracted from the fluid handling system via the liquid supply or extraction line.

In an embodiment, the fluid handling system further comprises a liquid supply or extraction opening connected to the liquid supply or extraction line configured to supply cleaning liquid to, or extract cleaning liquid from, a gap between the fluid handling system and the substrate and/or the table.

In an embodiment, the liquid supply or extraction line is connected to the liquid supply or extraction opening by a connector made of a material that is resistant to corrosion by an organic solvent.

In an embodiment, the lithographic apparatus further comprises a protection arrangement configured to prevent cleaning liquid from contacting the final element of the projection system.

In an embodiment, the protection arrangement is configured to prevent contact between cleaning liquid supplied to the gap and immersion liquid supplied to the space.

In an embodiment, the protection arrangement comprises a final element liquid supply opening configured to supply immersion liquid to the space, and a controller configured to control a supply of immersion liquid through the final element liquid supply opening such that during a cleaning operation there is a flow of immersion liquid across the final element in the space.

In an embodiment, the protection arrangement comprises a final element liquid supply opening configured to supply immersion liquid to the space, and a controller configured to control a supply of immersion liquid through the final element liquid supply opening such that during a cleaning operation, immersion liquid is supplied by the final element liquid supply opening at a higher pressure than cleaning liquid is supplied to the gap.

In an embodiment, the protection arrangement comprises a closing disk configured to provide a lower confining surface of the space, and a device configured to create and maintain a gap between the fluid handling system and the closing disk.

In an embodiment, the protection arrangement comprises a shutter member, placed within the fluid handling system, positionable on a side of the space opposite the projection system such that the liquid can be confined in the space and between the projection system and the shutter member.

In an embodiment, the protection arrangement comprises a plate substantially parallel to the substrate or the table to divide the space into two parts, the plate having an aperture.

In an embodiment, the protection arrangement comprises a liquid level sensor configured to monitor a level of liquid in the space, and a level controller configured to control supply of liquid during a cleaning operation such that the level of liquid does not exceed a certain level.

In an embodiment, the protection arrangement comprises a pressure supply configured to increase a pressure in the space directly below the final element to above atmospheric pressure.

In an embodiment, the lithographic apparatus further comprises a reference frame, a grating attached to the table or the reference frame, and a sensor attached to the other of the table and reference frame, the sensor configured to detect radiation diffracted and/or reflected by the grating to measure the relative position between the table and the reference frame.

In an aspect, there is provided a method of cleaning a surface of an immersion lithographic apparatus comprising supplying cleaning liquid via a liquid opening to a gap between a fluid handling system for confining immersion liquid to a space between a final element of a projection system and a substrate or a table, and the substrate and/or the table, extracting the cleaning liquid via a further liquid opening from the gap, and controlling a direction of liquid flow through the liquid opening and the further liquid opening such that the cleaning liquid is supplied to the gap via the further liquid opening and the cleaning liquid is extracted from the gap via the liquid opening.

In an embodiment, the method further comprises supplying immersion liquid to the gap via a supply opening radially outward from the space of the liquid opening and the further liquid opening.

In an embodiment, the method further comprises extracting the cleaning liquid from the gap via an extractor radially outward from the space of the supply opening.

In an aspect, there is provided a method of cleaning a surface of an immersion lithographic apparatus comprising supplying cleaning liquid via a liquid opening to gap between a fluid handling system for confining immersion liquid to a space between a final element of a projection system and a substrate or a table, and the substrate and/or the table, and supplying immersion liquid to the gap via a supply opening radially outward of the liquid opening from the space.

In an embodiment, the method further comprises extracting liquid from the gap via an extractor radially outward of the supply opening.

In an embodiment, the method further comprises preventing cleaning liquid from contacting the final element of the projection system.

In an embodiment, the preventing involves supplying immersion liquid to the space such that there is a flow of immersion liquid across the final element in the space.

In an embodiment, the preventing involves supplying immersion liquid to the space at a higher pressure than cleaning liquid is supplied to the gap.

In an embodiment, the preventing involves creating and maintaining a gap between the fluid handling system and a closing disk for providing a lower confining surface of the space.

In an embodiment, the preventing involves positioning a shutter member on a side of the space opposite the projection system such that the liquid can be confined in the space and between the projection system and the shutter member.

In an embodiment, the preventing involves monitoring a level of liquid in the space, and controlling a supply of liquid to the space such that the level of liquid does not exceed a certain level.

In an embodiment, the preventing involves increasing a pressure in the space directly below the final optical element to above atmospheric pressure.

In an embodiment, the method is for cleaning a grating attached to the table or a reference frame of the lithographic apparatus.

In an embodiment, the grating is part of a system for measuring a relative position between the table and the reference frame.

In an aspect, there is provided a lithographic apparatus comprising a fluid handling system configured to confine immersion liquid to a space between a final element of a projection system and a surface of a substrate and/or a table, the projection system configured to direct a patterned beam of radiation to a target portion of the substrate, the fluid handling system comprising a supply opening configured to supply cleaning liquid to a gap between the fluid handling system and the substrate and/or the table, and an extraction opening configured to extract cleaning liquid from the gap, the extraction opening being radially outward of the supply opening, and a controller configured to control a direction of liquid flow through the gap, so that at least a part of the liquid flow passes between the projection system and the surface of the substrate and/or table.

In an embodiment, the fluid handling system has at least two supply openings of which an upstream opening is formed upstream of the liquid passing between the projection system and the surface of the substrate and/or table and a downstream opening is formed downstream of the liquid passing between the projection system and the surface of the substrate and/or table.

In an embodiment, the controller is configured to control the downstream opening to supply liquid and the upstream opening to stop supplying liquid.

In an embodiment, the controller is configured to control the function of the at least two supply openings to function as upstream and downstream openings dependent of the position of the supplying opening to the liquid flow, in use, between the projection system and the surface of the substrate and/or table.

In an embodiment, the part of the liquid flow which passes between the projection system and the surface of the substrate and/or table, passes through a path of the patterned beam of radiation.

In an embodiment, the fluid handling system has an under-surface.

In an embodiment, one or more of the openings are formed in the under-surface.

In an embodiment, the extraction opening is formed in the under-surface.

In an embodiment, the substrate is a dummy surface.

In an embodiment, the table is the surface of a table, a measurement table and/or a shutter member.

In an embodiment, a liquid opening configured to supply immersion liquid and/or extract liquid is located radially inward of the supply opening.

In an embodiment, a porous member is in the liquid opening so the liquid flow through the liquid opening is through the porous member.

In an embodiment, an immersion liquid supply opening is configured to supply immersion liquid to the space.

In an embodiment, the immersion liquid supply opening is formed in a surface of the fluid handling system configured to confine immersion liquid to the space, so that the immersion liquid can dilute the cleaning liquid as it passes between the projection system and the surface of the substrate and/or table and so that the cleaning liquid is prevented from contacting a surface of the projection system.

In an embodiment, the lithographic apparatus comprises an immersion liquid controller configured to control the supply of immersion liquid through the immersion liquid supply opening such that during a cleaning operation an immersion liquid flow flows across the surface of the projection system that in part forms the space.

In an embodiment, the fluid handling system comprises a confinement structure which surrounds the space to confine the immersion liquid to the space.

In an aspect, there is provided a lithographic apparatus comprising a fluid handling structure configured to confine immersion liquid to a space between a final element of a projection system and a substrate and/or a table, the fluid handling structure comprising at least two openings that are configured, during exposure of a substrate, to extract immersion liquid from a gap between the fluid handling structure and the substrate and/or the table and are each configured, during a cleaning operation, to be an extraction opening to extract liquid or a supply opening to supply a cleaning liquid, and a controller configured to control the at least two openings such that during the cleaning operation, at least one opening is a supply opening and at least one opening is an extraction opening.

In an embodiment, a direction of liquid flow through the at least one supply opening and the at least one extraction opening, during the cleaning operation, are opposite.

In an embodiment, the direction of liquid flow is across the space.

In an embodiment, the openings form a closed loop on an under-surface of the fluid handling structure.

In an aspect, there is provided a lithographic apparatus comprising a fluid handling structure configured to confine immersion liquid to a space between a final element of a projection system and a substrate and/or a table, the projection system configured to direct a patterned beam of radiation to a target portion of the substrate, the fluid handling structure comprising at least two surfaces, of which a radially inner surface is formed around an optical path of the patterned beam of radiation and a radially outer surface is formed at an outer side of the radially inner surface, wherein the two surfaces are configured, during exposure of a substrate, to extract immersion liquid from a gap between the fluid handling structure and the substrate and/or the table and are configured, during a cleaning operation, to be an extraction surface to extract liquid or a supply surface to supply a cleaning liquid, and a controller configured to control the at least two surfaces such that during the cleaning operation, one of the at least two surfaces is a supply surface and another of the at least two surfaces is an extraction surface.

In an aspect, there is provided a method of cleaning a surface of an immersion lithographic apparatus comprising supplying immersion liquid to a space between a final element of a projection system and a substrate or a table, and supplying cleaning liquid to a gap between the substrate and/or the table and a fluid handling system for confining immersion liquid to the space, wherein the cleaning liquid is denser than the immersion liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid opening 10s, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus, comprising:
a movable table;
a projection system configured to project a radiation beam onto a radiation-sensitive substrate;
a fluid handling structure located above the table and configured to at least partly confine an immersion liquid within a space between the projection system and the movable table, the fluid handling structure comprising a recovery opening configured to recover immersion liquid into a chamber, the recovery opening comprising a porous member through which immersion liquid is recovered;
a fluid opening located above the table and located outward, relative to the path of the beam through the space, of the porous member; and
a control system configured to cause supply of a cleaning fluid of different composition than the immersion liquid within the fluid handling structure to the chamber of the recovery opening such that the recovery opening supplies the cleaning fluid from the chamber to the space during a cleaning operation and to cause the fluid opening to recover fluid at least during the cleaning operation.

2. The apparatus of claim 1, further comprising a liquid opening, outward relative to the path of the patterned beam, of the recovery opening, the liquid opening configured to supply a liquid to the space.

3. The apparatus of claim 2, wherein the control system is further configured to cause immersion liquid to be supplied by the liquid opening to the space.

4. The apparatus of claim 2, wherein at least part of the fluid opening is located outward, relative to the path of the beam through the space, of the liquid opening.

5. The apparatus of claim 1, wherein the control system is further configured to cause supply of immersion liquid during the cleaning operation to push cleaning fluid away from the projection system.

6. The apparatus of claim 1, wherein the chamber comprises a supply opening and an exhaust opening therein, the porous member forming a wall of the chamber, the exhaust opening configured to exhaust fluid out of the chamber, and the supply opening configured to supply, during the cleaning operation, cleaning fluid into the chamber.

7. The apparatus of claim 1, wherein the fluid opening is configured to recover fluid from at least the surface of the substrate during exposure.

8. The apparatus of claim 1, further comprising an opening or gap horizontally between the porous member and the fluid opening.

9. An immersion lithographic apparatus, comprising:
a movable table;
a projection system configured to project a radiation beam onto a radiation-sensitive substrate;
a fluid handling structure located above the table and configured to at least partly confine an immersion liquid within a space between the projection system and the movable table, the fluid handling structure, comprising a first recovery opening configured to recover immersion liquid, the first recovery opening comprising a porous member through which immersion liquid is recovered;
a fluid supply opening located above the table and outward, relative to the path of the beam through the space, of the porous member;
a second recovery opening located above the table and outward, relative to the path of the beam through the space, of the first recovery opening, the second recovery opening configured to recover fluid, wherein at least part of the second recovery opening is located outward, relative to the path of the beam through the space, of the fluid supply opening; and
a control system configured to cause supply of a cleaning fluid of different composition than the immersion liquid by the fluid supply opening during a cleaning operation.

10. The apparatus of claim 9, wherein the control system is further configured to cause immersion liquid to be supplied by the fluid supply opening to the space.

11. The apparatus of claim 9, wherein the control system is further configured to cause supply of a liquid during the cleaning operation from a supply opening configured to supply immersion liquid to the space.

12. The apparatus of claim 9, wherein the control system is configured to cause the second recovery opening to recover at least part of the cleaning fluid during the cleaning operation.

13. A device manufacturing method comprising:
at least partly confining an immersion liquid within a space between a projection system of a lithographic apparatus and a movable table of the lithographic apparatus using a fluid handling structure of the lithographic apparatus located above the table;

recovering immersion liquid from the space into a chamber within the fluid handling structure via a porous member of the fluid handling structure;

projecting a radiation beam through the immersion liquid onto a radiation-sensitive substrate;

during a cleaning operation, causing supply of a cleaning fluid of different composition than the immersion liquid within the fluid handling structure to the chamber of the porous member such that the porous member supplies the cleaning fluid from the chamber to the space; and at least during the cleaning operation, causing a fluid opening to recover fluid, the fluid opening located above the table and located outward, relative to the path of the beam through the space, of the porous member.

14. The method of claim 13, further comprising supplying a liquid to the space using a liquid opening, outward relative to the path of the patterned beam, of the recovery opening.

15. The method of claim 14, comprising causing immersion liquid to be supplied by the liquid opening to the space.

16. The method of claim 14, wherein at least part of the fluid opening is located outward, relative to the path of the beam through the space, of the liquid opening.

17. The method of claim 13, further comprising supplying immersion liquid during the cleaning operation to push cleaning fluid away from the projection system.

18. The method of claim 13, further comprising recovering fluid from at least the surface of the substrate during exposure using the fluid opening.

19. The method of claim 13, wherein an opening or gap is located horizontally between the porous member and the fluid opening.

20. The apparatus of claim 9, further comprising an opening or gap horizontally between the porous member and the second recovery opening.

* * * * *